United States Patent
Fettig et al.

(10) Patent No.: US 9,749,556 B2
(45) Date of Patent: Aug. 29, 2017

(54) IMAGING SYSTEMS HAVING IMAGE SENSOR PIXEL ARRAYS WITH PHASE DETECTION CAPABILITIES

(71) Applicant: SEMICONDUCTOR COMPONENTS INDUSTRIES, LLC, Phoenix, AZ (US)

(72) Inventors: Douglas Fettig, Meridian, ID (US); Marko Mlinar, Horjul (SL); Robert M. Gravelle, Jr., Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 123 days.

(21) Appl. No.: 14/667,286

(22) Filed: Mar. 24, 2015

(65) Prior Publication Data

US 2016/0286108 A1    Sep. 29, 2016

(51) Int. Cl.
*H04N 3/14* (2006.01)
*H04N 5/335* (2011.01)
(Continued)

(52) U.S. Cl.
CPC ........... *H04N 5/347* (2013.01); *G06T 3/4015* (2013.01); *G06T 5/002* (2013.01); *G06T 5/008* (2013.01);
(Continued)

(58) Field of Classification Search
CPC .... H04N 5/235; H04N 5/2226; H04N 5/2355; H04N 5/2357; H04N 5/347; H04N 5/37457; H04N 9/045; H04N 2209/046; G06T 3/4015; G06T 5/002; G06T 5/008; G06T 5/20; G06T 2207/10024; G06T 2207/20012; G06T 2207/20208
See application file for complete search history.

(56) References Cited

U.S. PATENT DOCUMENTS 8,730,545 B2    5/2014    Endo et al.
8,742,309 B2    6/2014    Agranov et al.
(Continued)

OTHER PUBLICATIONS

Mauritzson et al., U.S. Appl. No. 14/295,203, filed Jun. 3, 2014.
(Continued)

*Primary Examiner* — Twyler Haskins
*Assistant Examiner* — Carramah J Quiett
(74) *Attorney, Agent, or Firm* — Treyz Law Group, P.C.; Joseph F. Guihan

(57) ABSTRACT

An image sensor may have a pixel array that includes an array of pixels arranged in rows and columns. Each pixel may include a number of adjacent sub-pixels covered by a single microlens. The adjacent sub-pixels of each pixel may include color filter elements of the same color. Image signals from the sub-pixels may be used to calculate phase information in each pixel in the array. This information may be used to generate a depth map of the entire captured image. The pixels may each be able to detect vertical, horizontal, or diagonal edges. Additionally, the image signals from each photodiode in a pixel may be binned or average to obtain image data for each pixel. The image sensor also may generate high-dynamic-range images using the pixel array.

8 Claims, 13 Drawing Sheets

(51) Int. Cl.
*H04N 9/04* (2006.01)
*H04N 9/083* (2006.01)
*H04N 5/347* (2011.01)
*H04N 5/235* (2006.01)
*G06T 3/40* (2006.01)
*G06T 5/00* (2006.01)
*G06T 5/20* (2006.01)
*H01L 27/146* (2006.01)
*H04N 5/232* (2006.01)
*H04N 5/369* (2011.01)
*H04N 5/355* (2011.01)

(52) U.S. Cl.
CPC .......... *G06T 5/20* (2013.01); *H01L 27/14627* (2013.01); *H01L 27/14641* (2013.01); *H01L 27/14643* (2013.01); *H04N 5/2353* (2013.01); *H04N 5/2355* (2013.01); *H04N 5/23212* (2013.01); *H04N 5/23245* (2013.01); *H04N 5/35554* (2013.01); *H04N 5/3696* (2013.01); *H04N 9/045* (2013.01); *G06T 2207/10024* (2013.01); *G06T 2207/20012* (2013.01); *G06T 2207/20208* (2013.01); *H04N 2209/046* (2013.01)

(56) References Cited

U.S. PATENT DOCUMENTS

| | | |
|---|---|---|
| 9,106,826 B2 | 8/2015 | Aoki |
| 2008/0018662 A1 | 1/2008 | Gazeley |
| 2008/0259202 A1 | 10/2008 | Fujii |
| 2008/0274581 A1 | 11/2008 | Park |
| 2009/0230394 A1 | 9/2009 | Nagaraja et al. |
| 2010/0238330 A1* | 9/2010 | Hirota ............... H01L 27/14621 348/273 |
| 2011/0025904 A1 | 2/2011 | Onuki et al. |
| 2012/0019695 A1 | 1/2012 | Qian et al. |
| 2012/0043634 A1 | 2/2012 | Kurihara |
| 2012/0193515 A1 | 8/2012 | Agranov et al. |
| 2013/0038691 A1 | 2/2013 | Agranov et al. |
| 2013/0181309 A1 | 7/2013 | Johnson et al. |
| 2013/0182158 A1 | 7/2013 | Kobayashi et al. |
| 2013/0222552 A1 | 8/2013 | Agranov et al. |
| 2013/0222662 A1 | 8/2013 | Sakurai et al. |
| 2013/0271646 A1 | 10/2013 | Hamano |
| 2014/0146197 A1* | 5/2014 | Okuzawa ............ H04N 5/23212 348/222.1 |
| 2014/0192248 A1 | 7/2014 | Kishi |
| 2014/0307133 A1* | 10/2014 | Kawai ...................... H04N 9/07 348/273 |
| 2015/0001589 A1 | 1/2015 | Tazoe et al. |
| 2015/0062422 A1 | 3/2015 | Stern |
| 2015/0256734 A1* | 9/2015 | Fukuhara ............. H04N 5/2355 348/294 |
| 2015/0312461 A1* | 10/2015 | Kim .................. H01L 27/14609 348/308 |

OTHER PUBLICATIONS

Mlinar, U.S. Appl. No. 14/319,867, filed Jun. 30, 2014.
Fettig et al., U.S. Appl. No. 14/267,695, filed May 1, 2014.
Keelan et al., U.S. Appl. No. 14/614,104, filed Feb. 4, 2015.

* cited by examiner

IMAGING SYSTEMS HAVING IMAGE SENSOR PIXEL ARRAYS WITH PHASE DETECTION CAPABILITIES

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Conventional image sensors sample the visible light spectrum using red, green, and blue (RGB) image pixels arranged in a Bayer mosaic pattern. The Bayer Mosaic pattern consists of a repeating cell of two-by-two image pixels, with two green pixels diagonally opposite one another, and the other corners being red and blue.

Certain applications, such as automatic focusing and three-dimensional (3D) imaging, may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Some electronic devices include both image pixels and phase detection pixels in a single image sensor. With this type of arrangement, a camera can use the on-chip phase detection pixels to focus an image without requiring a separate phase detection sensor. In a typical arrangement, phase detection pixels all have the same color and are arranged consecutively in a line in the pixel array, replacing normal image pixels. This arrangement prevents the image sensor from obtaining all of the data that would be generated by normal image pixels. Compensating for the missing image pixel data can be difficult and can result in visual artifacts in the processed image. When phase detection pixels are arranged in this way, optical crosstalk becomes problematic. For example, optical crosstalk from a phase detection pixel into an adjacent normal image pixel may not match the crosstalk that would have occurred from the standard image pixel that would have occupied the phase detection pixel position. This could be due to the phase detection having a different microlens shape or the phase detection pixel being a different color from the normal color of a standard image pixel at that position.

It would therefore be desirable to be able to provide improved image sensors with phase detection pixel arrangements for image sensors.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
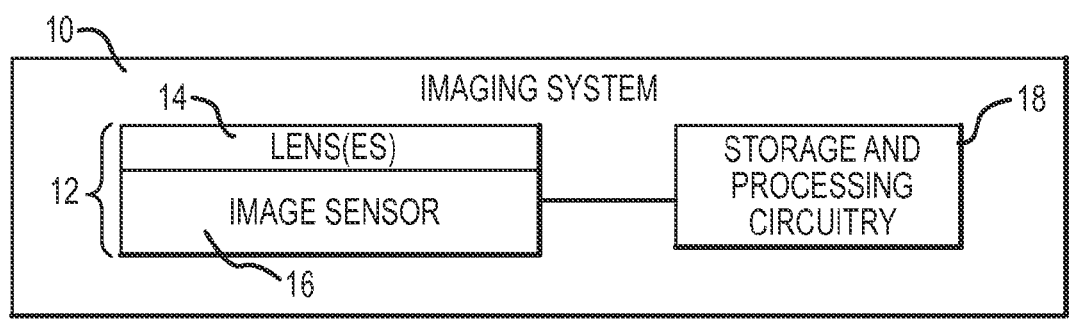
FIG. 1 is a diagram of an illustrative electronic device having an image sensor and processing circuitry for capturing images using an array of image pixels having photosensitive regions with phase detection capabilities in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2A:
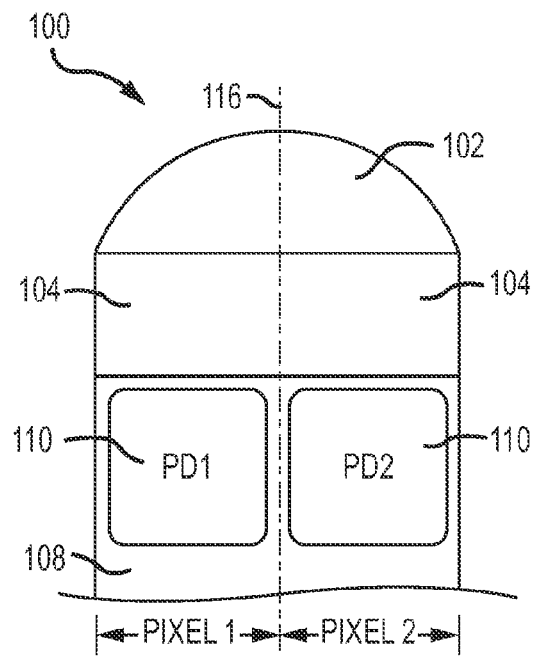
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Microlens 102 may have a width and a length, with the length being longer than the width. Microlens 102 may have a length that is about twice as long as its width. Alternatively, microlens 102 may have a width that is about twice as long as its height. Microlens 102 may also have similar lengths and heights.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

As examples, photodiodes PD1 and PD2 may each cover approximately half of the substrate area under microlens 102 or may each cover approximately a quarter of the substrate area under microlens 102. By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
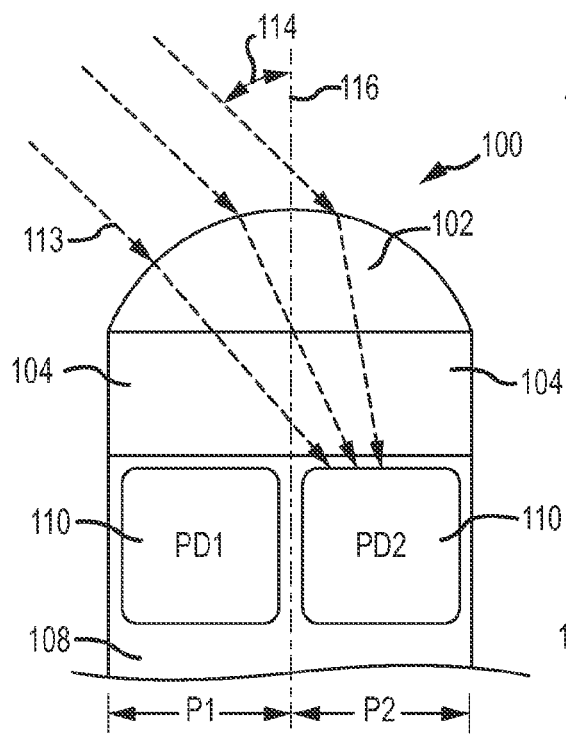
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
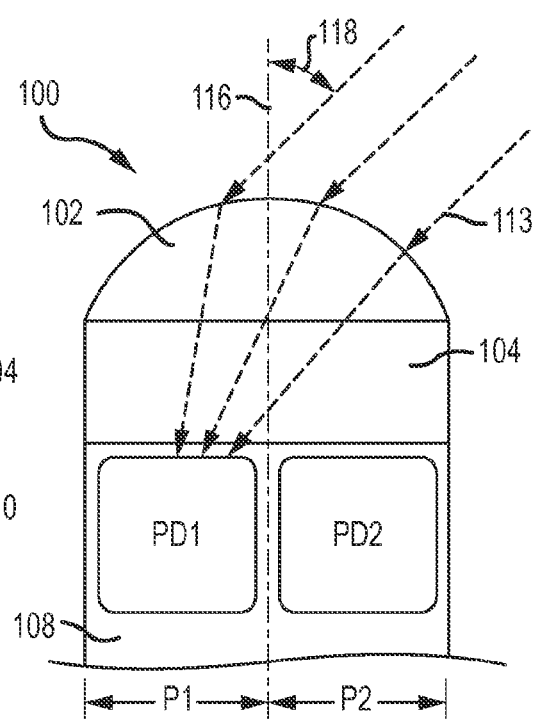

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
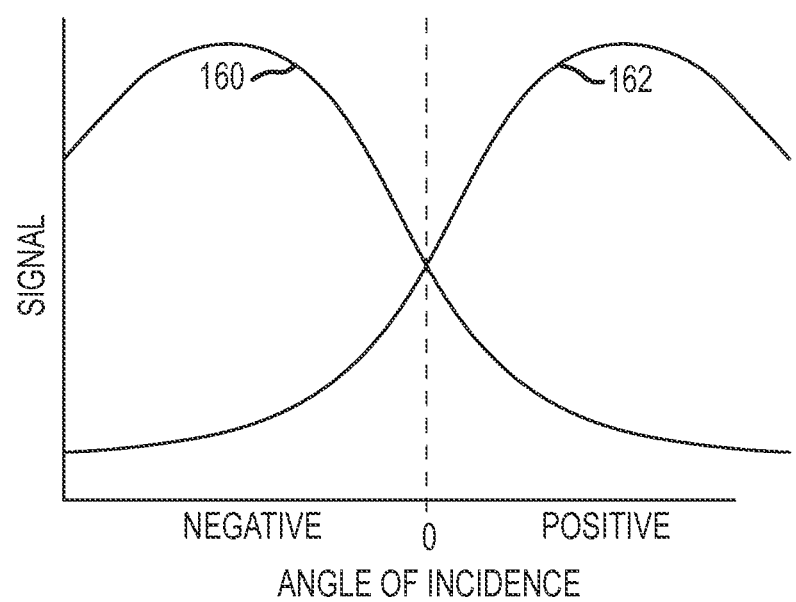
FIG. 3 is a diagram of illustrative signal outputs of phase detection pixels for incident light striking the phase detection pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area. In some embodiments, photodiodes 110 may cover less than a quarter of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Figure 4:
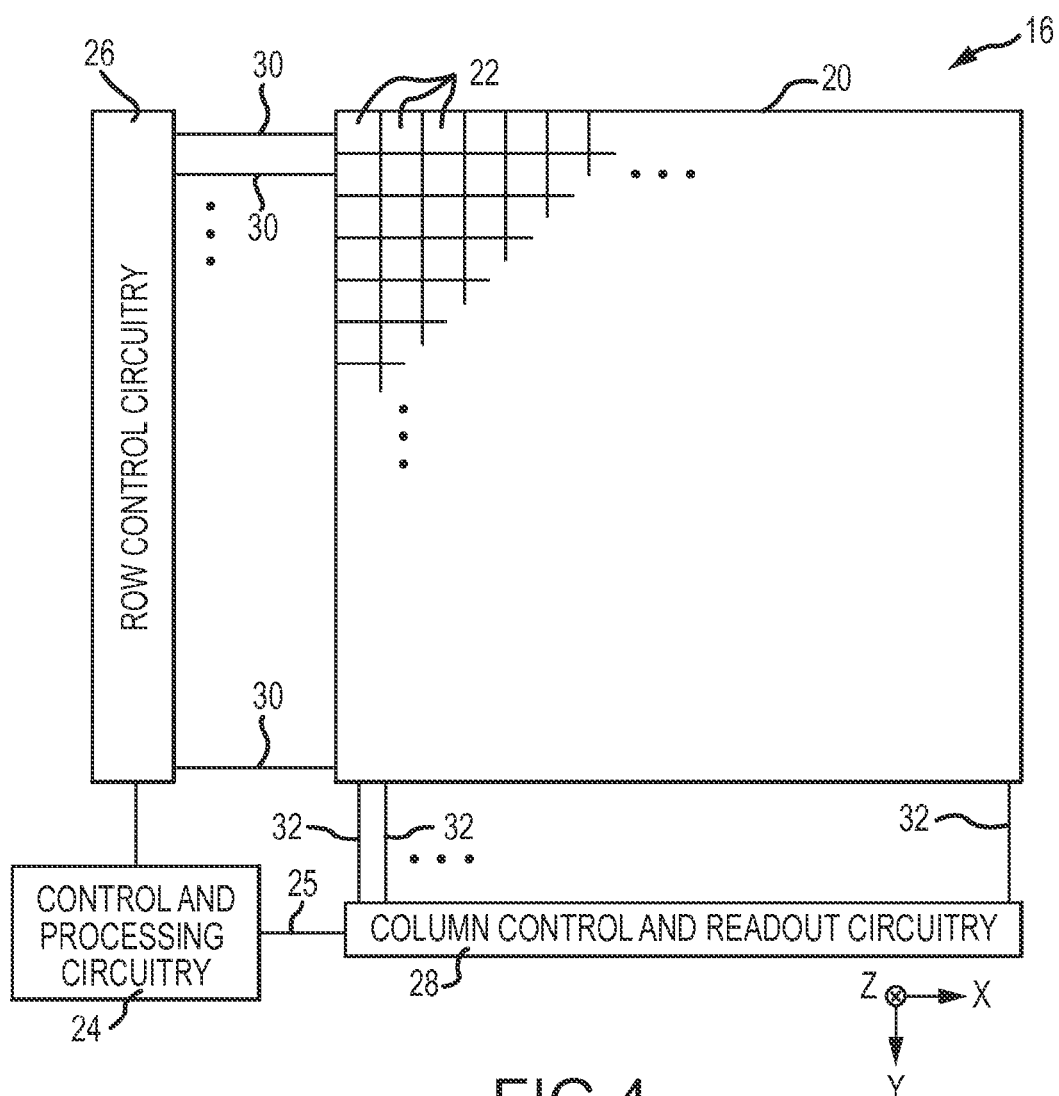
FIG. 4 is a diagram of an illustrative pixel array and associated readout circuitry for reading out image signals from the pixel array in accordance with an embodiment of the present invention.

As shown in FIG. 4, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. It may therefore be desirable to be able to provide image sensors with an improved means of capturing images. In another suitable example, the green pixels in a Bayer pattern are replaced by broadband image pixels having broadband color filter elements. These examples are merely illustrative and, in general, color filter elements of any desired color and in any desired pattern may be formed over any desired number of image pixels 22.

Figure 5:
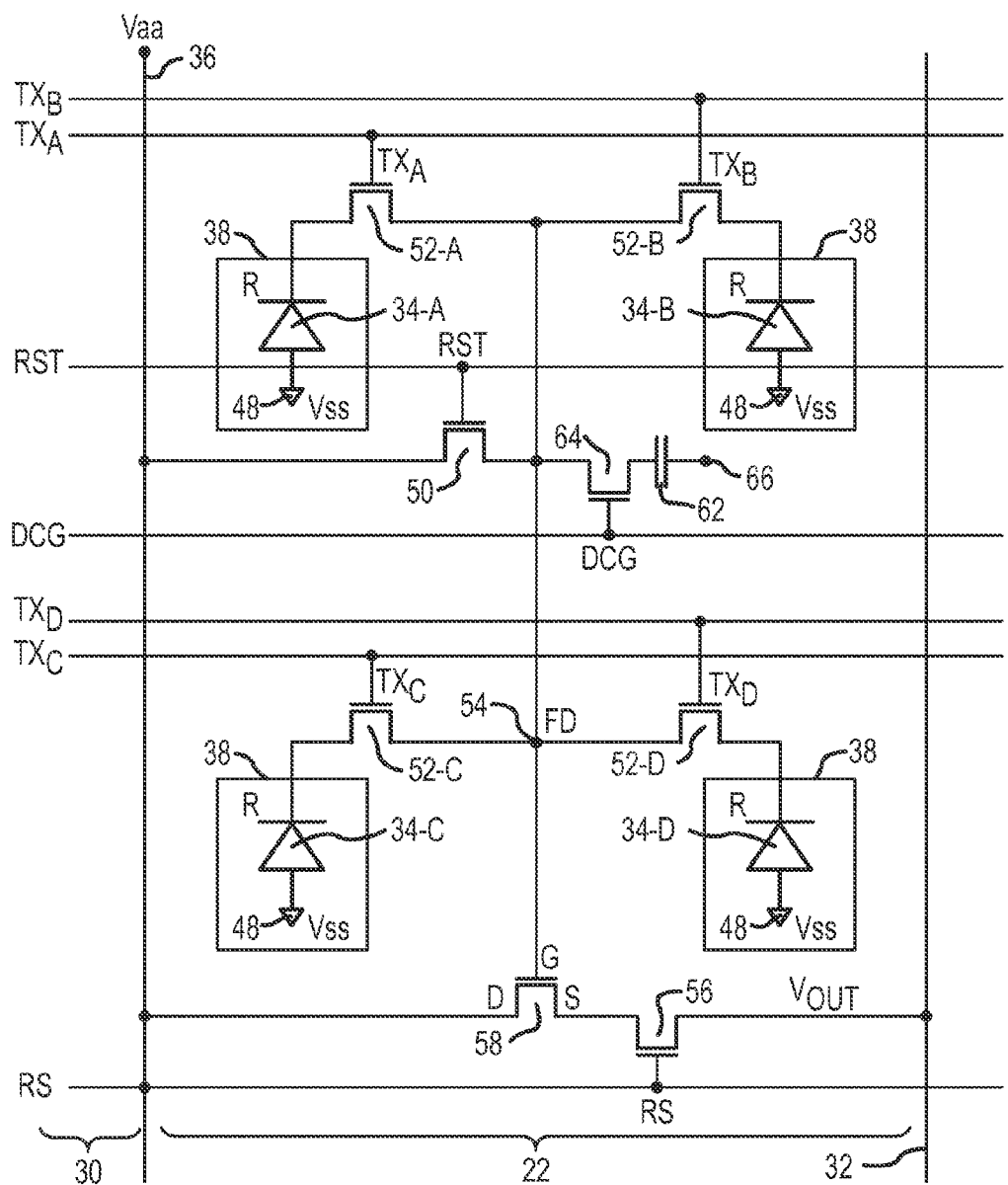
FIG. 5 is a circuit diagram of an illustrative image sensor pixel having multiple photodiodes (e.g., multiple sub-pixels) with a shared charge storage region in accordance with an embodiment of the present invention.

FIG. 5 is a circuit diagram of an illustrative image sensor pixel 22 having multiple photosensitive regions 34. As shown in FIG. 5, image pixel 22 may include multiple photosensitive regions (photosensitive elements) such as photodiodes 34 (e.g., a first photodiode 34-A, a second photodiode 34-B, a third photodiode 34-C, and a fourth photodiode 34-D). A positive power supply voltage (e.g., voltage Vaa or another reset-level voltage) may be supplied at positive power supply terminal 36. A ground power supply voltage (e.g., Vss) may be supplied at ground terminals 48. Incoming light may be collected by photosensitive elements such as photodiodes 34 after passing through corresponding color filter structures such as color filter elements 38.

In the example of FIG. 5, each photodiode 34 is provided with a respective red (R) color filter element 38 so that photodiodes 34 generate charge in response to red light. Color filter elements 38 covering each photodiode 34 in pixel 22 may all be the same color (e.g., red, blue, green, yellow, clear, etc.) or may be different colors (e.g., a first pair of photodiodes 34 in pixel 22 may be provided with blue color filter elements 38 and a second pair of photodiodes 34 in pixel 22 may be provided with red color filter elements 38, each photodiode may be provided with a different colored color filter element, etc.). Color filter elements 38 may be formed from a single continuous color filter element that covers each of photodiodes 34 (sometimes referred to herein as a color plane), may be formed from multiple color filter elements that cover multiple photodiodes 34 (e.g., a single color filter element may cover a first pair of photodiodes 34, a single color filter element may cover a second pair of photodiodes 34, etc.), or may be formed from separate distinct color filter elements that each cover a corresponding photodiode 34. Photodiodes 34 convert the incoming light that passes through the corresponding color filter element into electrical charge.

If desired, control circuitry 26 (as shown in FIG. 2) may assert reset control signal RST before an image is acquired. This turns on reset transistor 50 and resets charge storage node 54 (also referred to as floating diffusion node FD or floating diffusion region FD) to Vaa or another reset-level voltage. Charge storage node 54 may be shared by each photosensitive region 34 in pixel 22 and may store charge generated by each photosensitive region 34 in pixel 22. Charge storage node 54 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiodes 34 (e.g., region 54 may have a corresponding charge capacity indicative of the amount of charge that can be stored at region 54). The signal associated with the stored charge on node 54 is conveyed to row select transistor 56 by source-follower transistor 58.

Each photodiode 34 in pixel 22 may be coupled to shared charge storage region 54 through a corresponding charge transfer gate 52 (e.g., a first charge transfer gate 52-A may be coupled between photodiode 34-A and node 54, a second charge transfer gate 52-B may be coupled between photodiode 34-B and node 54, a third charge transfer gate 52-C may be coupled between photodiode 34-C and node 54, and a fourth charge transfer gate 52-D may be coupled between photodiode 34-D and node 54). Control circuitry 26 may provide corresponding charge transfer control signals TX to the gate terminal of each charge transfer gate 52 (e.g., may provide a first charge transfer control signal $TX_A$ to charge transfer gate 52-A, may provide a second charge transfer control signal $TX_B$ to charge transfer gate 52-B, etc.).

The reset control signal RST may be deasserted to turn off reset transistor 50. After the reset process is complete, transfer gate control signals TX may be asserted to turn on corresponding transfer gates 52. When transfer transistors 52 are turned on, the charge that has been generated by the corresponding photodiode 34 in response to incoming light is transferred to shared charge storage node 54. Transfer gates TX may be pulsed once to perform one charge transfer operation or may be pulsed multiple times to perform multiple charge transfer operations (e.g., to extend the effective charge well capacity of the corresponding photodiodes). When it is desired to read out the value of the stored charge (i.e., the value of the stored charge that is represented by the signal at the source S of transistor 58), row select control signal RS may be asserted. When signal RS is asserted, transistor 56 turns on and a corresponding image signal $V_{OUT}$ that is representative of the magnitude of the charge on shared charge storage node 54 (e.g., a reset-level or an image-level voltage from one or more photodiodes 34 in pixel 22) is produced on output path 32. In a typical configuration, there are numerous rows and columns of image pixels such as image pixel 22 in image pixel array 20. When row select control signal RS is asserted in a given row, a path such as column line 32 may be used to route signal $V_{OUT}$ from that image pixel to readout circuitry such as image readout circuitry 28 of FIG. 2. If desired, reset-levels and image-levels may be sampled, held, and converted for each image pixel 22 to allow for kTc reset noise compensation, for example.

If desired, pixel 22 may be operated in so-called "low resolution" and "high resolution" modes. In the low resolution mode, charge is transferred (e.g., constructively transferred) from each photodiode 34 to shared charge storage region 54 and image signals corresponding to a sum of the transferred charges (e.g., the charge generated by each of photodiodes 34) is stored at region 54 and readout over column line 32. For example, charge may be transferred from each of photodiodes 34 to shared charge storage node 54 simultaneously. In the high resolution mode, charge is transferred from a single photodiode 34 to shared charge storage node 54 at a time, and image signals corresponding to the charge generated by each photodiode 34 are separately readout and sampled over column line 32 by readout circuitry 28.

Pixels 22 may be provided with gain selection circuitry that enhances the dynamic range of the images produced by image sensor 16. For example, each pixel may generate a corresponding output value using a selected gain setting. In some configurations, a selected gain setting may depend on the amount of light captured by the pixel during an exposure (i.e., an integration period between resets of the pixel during which a photosensitive element generates charges in response to incoming light). In other configurations, the gain may be kept at a constant setting. As shown in FIG. 4, image pixel 28 may include capacitor 64 and transistor 62 coupled in series between terminal 66 and shared floating diffusion node 54. In one suitable arrangement, terminal 66 may be coupled to positive power supply voltage Vaa. In another suitable arrangement, terminal 66 may be coupled to ground power supply Vss. Transistor 64 may have a gate terminal that is controlled using dual conversion gain signal DCG. Pixel 22 may be operable in a high conversion gain mode and in a low conversion gain mode. If transistor 64 is disabled (e.g., if signal DCG is low), pixel 22 is placed in the high conversion gain mode. If transistor 64 is enabled (e.g., if signal DCG is high), pixel 22 is placed in the low conversion gain mode.

In general, pixel conversion gain is inversely proportional to the amount of loading capacitance at node FD. When transistor 64 is turned on, capacitor 62 is switched into use in order to provide shared floating diffusion node 54 with additional capacitance (e.g., additional charge storage capacity). This results in a lower conversion gain for pixel 22. When transistor 64 is turned off, the additional loading of capacitor 66 is removed and pixel 22 reverts to a relatively higher pixel conversion gain configuration. If desired, pixel 22 may be operated in high conversion gain mode (e.g., transistor 64 may be turned off) when operating in the high resolution mode and may be operated in low conversion gain mode (e.g., transistor 64 may be turned on) when operating in the low resolution mode (e.g., because total transferred charge stored on node 54 will be less when reading out individual photodiodes 34 in the high resolution mode than compared to the sum of charges transferred by each photodiode 34 to node 54 in the low resolution mode). In this way, low conversion gain may be provided to accommodate charge summing (multiple pixel) readout when operating in the low resolution mode, for example.

In the example of FIG. 5, four photodiodes 34 are arranged in two adjacent (e.g., consecutive) rows and two adjacent columns. This example is merely illustrative. Pixel 22 may include any number of photodiodes 34 sharing a common charge storage node 54, reset transistor 50, and row select transistor 56. For example, pixel 22 may include one photodiode 34, two photodiodes 34 that share a single floating diffusion node 54, reset gate 50, and row select gate 56, three photodiodes 34 that share a single floating diffusion node 54, reset gate 50, and row select gate 56, more than four photodiodes 34 that share a single floating diffusion node 54, reset gate 50, and row select gate 56, etc. Photodiodes 34 within pixels 22 may be arranged in any desired manner. For example, each photodiode 34 in a given pixel 22 may be arranged in a single row, a single column, multiple adjacent rows, or multiple adjacent columns.

Photosensitive regions 34 within pixel 22 may sometimes be referred to herein as sub-pixels 34. Pixels 22 may sometimes be referred to herein as a super-pixel 22, because pixels 22 may include multiple sub-pixels 34. Sub-pixels 34 provided with red color filter elements may sometimes be referred to herein as red sub-pixels 34, sub-pixels provided with blue color filter elements may sometimes be referred to herein as blue sub-pixels 34, sub-pixels 34 provided with green color filter elements may sometimes be referred to herein as green sub-pixels 34, sub-pixels 34 provided with broadband color filter elements may sometimes be referred to herein as broadband sub-pixels 34, etc.

If desired, the pixel 22 shown in FIG. 5 may be formed adjacent to two pixels 22 covered with green color filter elements 38 (e.g., two pixels 22 each having four green sub-pixels 34) that are diagonally opposite to one another and may be formed diagonally opposite to a pixel 22 covered with blue color filter elements 38 (e.g., a pixel 22 having four blue sub-pixels 34) to form a unit cell of repeating pixels 22. This pattern (unit cell) of pixels 22 may be repeated across array 20. In this way, a Bayer mosaic pattern of pixels 22 may be formed across array 20, where each pixel 22 includes four sub-pixels 34 arranged in two corresponding adjacent rows and two corresponding adjacent columns, having a shared charge storage region 54, and that generate image signals in response to a corresponding color of light. In an arrangement of this type, two (dual) column lines may be used to gather red and green image signals generated by vertically adjacent image pixels 22, thereby improving the readout time relative to conventional Bayer mosaic image sensors in which a single column line is used to readout vertically adjacent pixels. As an example, a first two-by-two group of sub-pixels 34 may share a common floating diffusion node and a second two-by-two group of sub-pixels 34 may share a separate common floating diffusion node. The second two-by-two group may be located in two rows immediately below the first two-by-two group in the array. The first group may share a first column output line, whereas the second group may share a second column output line. Both the first and second groups in this example may be read out simultaneously. For example, sub-pixels in the first and third rows may be read out simultaneously over the two column output lines and the second and fourth rows may be read out simultaneously over the two column output lines, thereby improving readout speed relative to embodiments where both the first and second groups share a single column output line.

Figure 6:
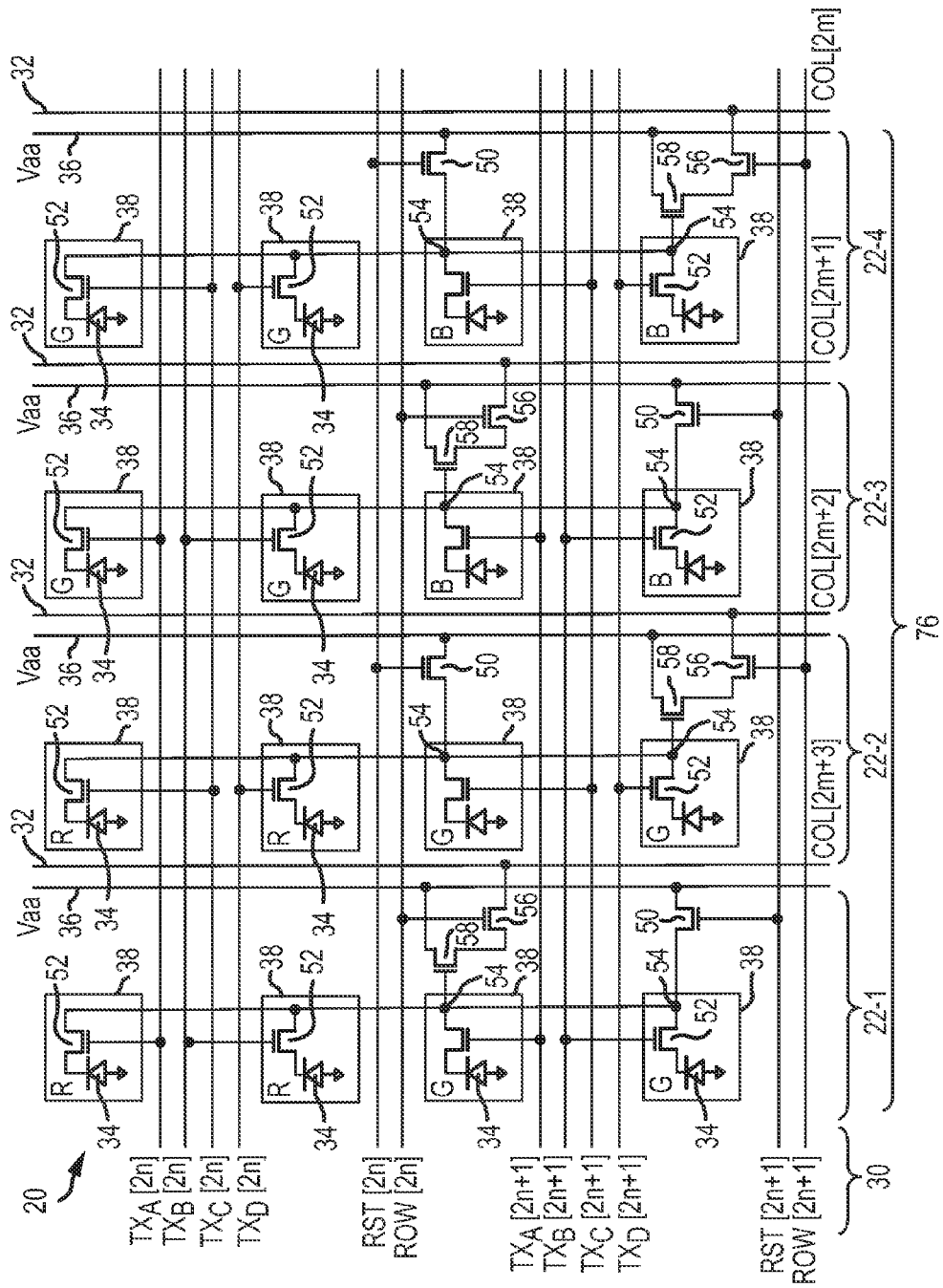
FIG. 6 is a circuit diagram of an illustrative image sensor pixel array having pixels with multiple photodiodes and a shared charge storage region arranged in a single column in accordance with an embodiment of the present invention.

FIG. 6 is a circuit diagram showing an example of another illustrative arrangement for image pixels 22 (e.g., a first image pixel 22-1, a second image pixel 22-2, a third image pixel 22-3, and a fourth image pixel 22-4) within array 20. As shown in FIG. 6, each pixel 22 in array 20 may include four sub-pixels 34 arranged in a single column. The sub-pixels 34 in the first pair of rows of first pixel 22-1 and second pixel 22-2 may be covered with red (R) color filter elements 38, the second pair of rows of first pixel 22-1 and second pixel 22-2 may be covered with green (G) color filter elements 38, the first pair of rows of third pixel 22-3 and fourth pixel 22-4 may be covered with green (G) color filter elements 38, and the second pair of rows of third pixel 22-3 and fourth pixel 22-4 may be covered with blue (B) color filter elements 38. If desired, adjacent red color filter elements 38 may be formed from a single continuous red color filter element (e.g., a single red color filter element may cover portions of both first pixel 22-1 and second pixel 22-2), adjacent green color filter elements 38 may be formed from a single continuous green color filter element (e.g., a single green color filter element may cover portions of both pixels 22-1 and 22-2), etc. The arrangement of pixels 22 shown in FIG. 6 may form a unit cell 76 that is repeated across array 20 to form a Bayer mosaic pattern with color filters 38. In this way, each pixel 22 in array 20 may generate charge in response to light of multiple different colors and may store the charge in shared charge storage nodes 54. The diagram of FIG. 5 does not show a DCG transistor 64 or capacitor 62 (e.g., as shown in FIG. 4) for the sake of simplicity. If desired, each pixel 22 in FIG. 6 may include a DCG transistor 64 and capacitor 62 coupled to the corresponding floating diffusion node 54.

The example of FIGS. 5 and 6 are merely illustrative. If desired, sub-pixels 34 may be provided with color filter elements of any desired colors (e.g., the red, green, and blue color filter elements of FIGS. 4 and 5 may be replaced with infrared color filter elements, ultraviolet color filter elements, red color filter elements, blue color filter elements, magenta color filter elements, cyan color filter elements, clear color filter elements, yellow color filter elements, etc.). Limitations of signal to noise ratio (SNR) that are associated with the Bayer Mosaic pattern can make it difficult to reduce the size of image sensors such as image sensor 16. In one suitable arrangement that is sometimes discussed herein as an example, the green color filter elements shown in FIGS. 5 and 6 are replaced by broadband color filter elements. For example, array 20 as shown in FIG. 6 may include four adjacent red sub-pixels 34 formed diagonally opposite to four adjacent blue sub-pixels 34 and adjacent to four broadband sub-pixels 34 that are diagonally opposite to four additional broadband sub-pixels 34. In another suitable arrangement, each pixel 22 may include a single photosensitive region 34 and pixels 22 may be arranged in four-pixel by four-pixel repeating unit cells each having four red pixels 22 in the first two columns of the first two rows of the unit cell, four green pixels 22 in the third and fourth columns of the first two rows of the unit cell, four green pixels 22 in the third and fourth rows of the first two columns of the unit cell, and four blue pixels 22 in the third and fourth rows of the third and fourth columns of the unit cell.

In another suitable arrangement, the red color filter element in the first row, second column, the red color filter element in the second row, first column, the blue color filter element in the fourth row, third column, the and the blue color filter element in the third row, fourth column of FIG. 6 may be replaced with green color filters 38. In this scenario, the green color filter element in the third row, first column, the green color filter element in the first row, third column, and the blue color filter element in the third row, third column may be replaced with red color filters 38, and the red color filter in the second row, second column, the green color filter element in the fourth row, second column, and the green color filter element in the second row, fourth column may be replaced with blue color filter elements 38. In general, any desired color filter elements may be used.

Broadband sub-pixels 34 may be formed with a visibly transparent color filter that transmits light across the visible light spectrum (e.g., broadband sub-pixels 34 may be provided with clear color filter elements 38 and may capture white light). Broadband sub-pixels 34 may have a natural sensitivity defined by the material that forms the transparent color filter 38 and/or the material that forms the corresponding photosensitive region (e.g., silicon). In another suitable arrangement, broadband sub-pixels 34 may be formed without any color filter elements. The sensitivity of broadband sub-pixels 34 may, if desired, be adjusted for better color reproduction and/or noise characteristics through use of light absorbers such as pigments. Broadband sub-pixels 34 may be sensitive to light across the entire visible light spectrum or may be sensitive to broad portions of the visible light spectrum. Broadband sub-pixels 34 may be generally defined herein as sub-pixels 34 having a substantial response to any suitable combination of light of at least two of the following colors: red, green, and blue. In this way, broadband sub-pixels 34 may have a broadband response relative to the colored sub-pixels in array 20. If desired, broadband sub-pixels 34 may have clear color filter elements in which a pigment such as a yellow pigment has been added to clear color filter element material (e.g., so that the color filter 38 of broadband sub-pixels 34 pass red and green light and associated broadband image signals are not generated in response to blue light).

Figure 7:
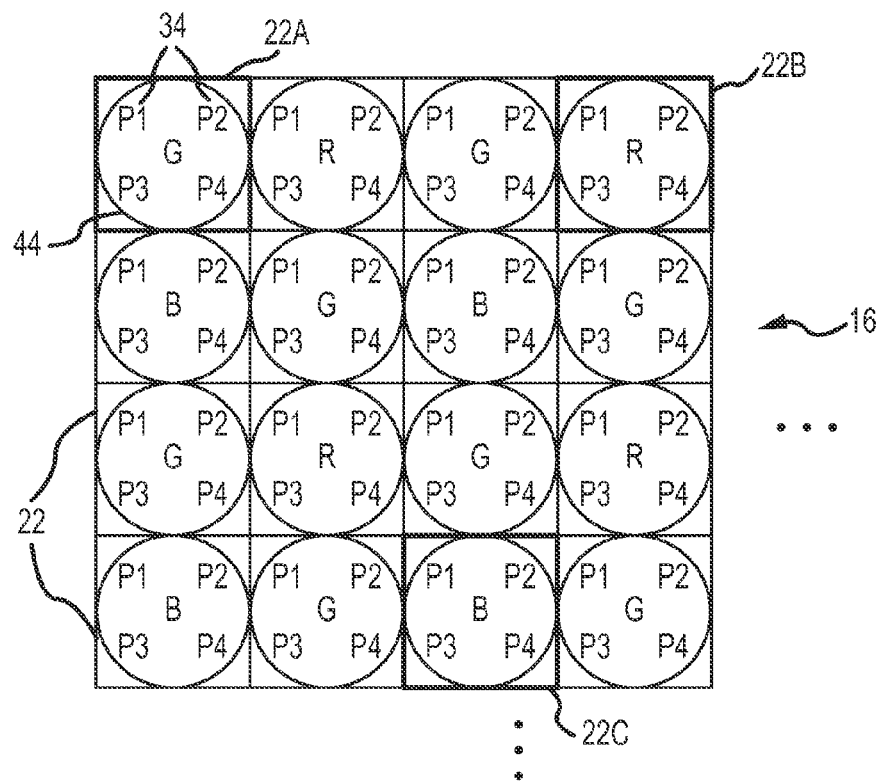
FIG. 7 is a diagram of an illustrative image sensor that includes pixels with multiple sub-pixels covered by a single microlens in accordance with an embodiment of the present invention.

FIG. 7 is an illustrative diagram showing an image sensor that may include pixels with multiple sub-pixels covered by a single microlens 44. As shown, each pixel 22 includes a number of sub-pixels 34. In this illustrative example, each pixel has four sub-pixels (P1, P2, P3, and P4). Each sub-pixel may have a respective photosensitive area. Each sub-pixel in pixel 22 may be covered by a color filter element of the same color. For example, sub-pixels P1, P2, P3, and P4 in pixel 22A may be covered by a green color filter element. Sub-pixels P1, P2, P3, and P4 in pixel 22B may be covered by a red color filter element. Sub-pixels P1, P2, P3, and P4 in pixel 22C may be covered by a blue color filter element. Each sub-pixel may have a respective color filter element, multiple color filter elements may each cover multiple sub-pixels in each pixel 22, or a single color filter element may cover all four sub-pixels in each pixel 22.

Pixel 22A may be a green pixel formed adjacent to a blue pixel, adjacent to a red pixel, and diagonally opposite a second green pixel to form a unit cell of repeating pixels 22. In this way, a Bayer mosaic pattern of pixels 22 may be created where each pixel 22 includes four sub-pixels 34 arranged in two corresponding adjacent rows and two corresponding adjacent columns.

Forming each pixel 22 with a single microlens 44 that covers a number of sub-pixels 34 of the same color enables image sensor 16 to have phase detection capabilities. As shown in FIGS. 2A-2C and FIG. 3, covering multiple photodiodes with a single microlens provides the photodiodes with an asymmetric angular response to incident light. The data acquired from the sub-pixels may then be used to obtain phase detection data. In some examples, the data acquired from two sub-pixels may be compared to obtain phase detection data.

Any pair of sub-pixels may be used to calculate phase detection data. Sub-pixels may be used that are in the same row (e.g., P1 and P2 or P3 and P4), in the same column (e.g., P1 and P3 or P2 and P4), or diagonally opposite each other (e.g., P1 and P4 or P2 and P3). The variety of available sub-pixel combinations enables image sensor 16 to detect a variety of types of edges. Horizontally oriented phase detection pixel pairs (e.g., P1 and P2) may be better suited to detect vertical edges in a scene, whereas vertically oriented phase detection pixel pairs (e.g., P1 and P3) may be better suited to detect horizontal edges in a scene. Similarly, the sub-pixels that are diagonally opposite each other (e.g., P1 and P4 or P2 and P3) may be suited to detect diagonal edges in the scene. In certain embodiments, image sensor 16 may use storage and processing circuitry 18 to use the data from P1, P2, P3, and P4 to search for edges in all orientations. Additionally, because different colored pixels (e.g., red, blue, green, etc.) all have phase detection capabilities, image sensor 16 may be able to detect edges in multiple colors. This will further improve the phase detection capabilities of image sensor 16.

The arrangement of FIG. 7 results in phase detection data being obtained across the entire pixel array of the image sensor. This results in a greater quantity of phase detection data available which may result in improved phase detection. In particular, the high density of phase detection pixels may improve resolution of fine details throughout the scene. In certain applications, the phase detection data from across the entire pixel array may be used to create a depth map of the entire captured scene.

Figure 8:
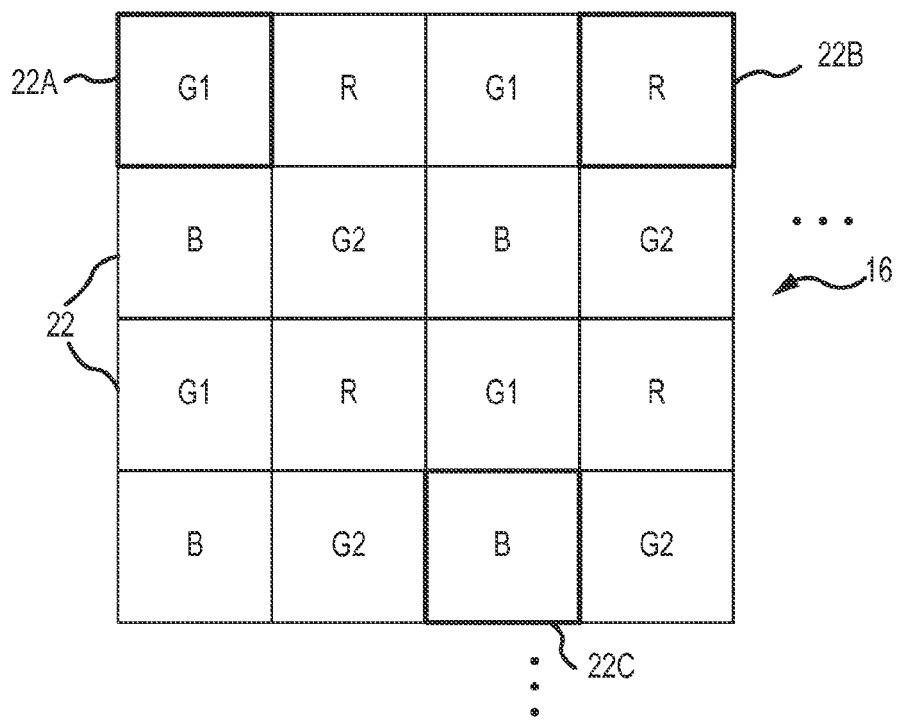
FIG. 8 is a diagram of the illustrative image sensor of FIG. 7 with the data obtained by the sub-pixels averaged to a signal representative value in accordance with an embodiment of the present invention.

FIG. 8 shows how the data obtained by the sub-pixels in the image sensor of FIG. 7 may be combined to form a signal representative value. As shown, the value from sub-pixels P1, P2, P3, and P4 may be averaged or binned. The result is a lower resolution image that has accurate color information for each pixel. For example, the individual values of sub-pixels P1, P2, P3 and P4 of pixel 22A may not provide accurate image data due to each sub-pixel having an asymmetric angular response to incoming light. However, if all four values are averaged, the result is a single value that is close to the value of an ordinary green pixel (i.e., there is minimal asymmetric angular response). Similarly, the values of the sub-pixels in pixels 22B and 22C may be averaged to obtain values for red and blue pixels, respectively. The result of averaging the pixels is shown in FIG. 8, where each pixel has a signal value that is close to the value of an ordinary pixel. In this way, each pixel 22 may be used to gather image data in addition to phase detection data.

The arrangement shown in FIGS. 7 and 8 provides an advantage over conventional image sensors with designated phase detection pixels and image pixels. In these types of conventional image sensors, the phase detection pixels eliminate image pixels and the accompanying image data that would normally be obtained in those parts of the image sensor. This results in areas of the image sensor with an absence of image data. These areas must be corrected in the final image via interpolation or other methods. Another problem with conventional image sensors is that phase detection pixels can interrupt the color filter pattern used throughout the sensor. Algorithms that correct for optical crosstalk in pixel arrays with a particular type of color filter pattern are less effective in correcting optical crosstalk when the color filter pattern is disrupted. The arrangement of FIGS. 7 and 8 eliminates these potential problems. By averaging the values of each sub-pixel as shown in FIG. 8, image data is obtained throughout the entire array and there is no disruption to the color filter pattern.

In some conventional image sensors, phase detection pixels are arranged such that two adjacent pixels are covered by a single microlens. These arrangements are sometimes referred to as 2×1 or 1×2 arrangements. These arrangements require an elliptical microlens. An elliptical microlens focuses light to two points, which may not be desirable in certain circumstances. The embodiments of FIGS. 7 and 8 enable a more circular microlens to be used. The circular microlens may focus light on a single point, which may improve quality of the image and phase detection data. It should be noted that in some circumstances it may desirable to slightly defocus microlens 44 in pixels 22. When microlens 44 is highly focused, light may be focused to the exact center of each pixel. Because the sub-pixels 34 of pixel 22 are positioned around the center of each pixel 22, a highly focused microlens may result in sub-pixels 34 being exposed to less light. Defocusing microlens 44 so that sub-pixels 34 receive more incident light may result in more robust phase detection data.

Another advantage of the arrangement shown in FIGS. 7 and 8 may be increased full well capacity. Full well capacity is a measure of the amount of charge an individual pixel can hold before becoming saturated. Pixels becoming saturated may decrease the quality of an image. Therefore, it is desirable for a pixel to be able to hold as much charge as possible so that the pixel becomes saturated less often. Splitting a single pixel photo-diode as used in a conventional image sensor into the 2×2 arrangement of photodiodes shown in FIG. 7 may increase full well capacity when the full well capacity of the four photodiodes are added together. The small sub-pixels of FIG. 7 may be able to receive a higher dose of ion implants than on a single larger pixel. The cross-sectional area of the four smaller photodiodes summed together may be greater than the cross-sectional area of a single large photodiode. Additionally, the isolation regions between each sub-pixel 34 may be processed or doped differently than the isolation regions between each pixel 22 in order to enhance the full well capacity of each pixel 22. These factors may increase full well capacity of pixels 22 compared to a conventional image sensor.

Figure 9:
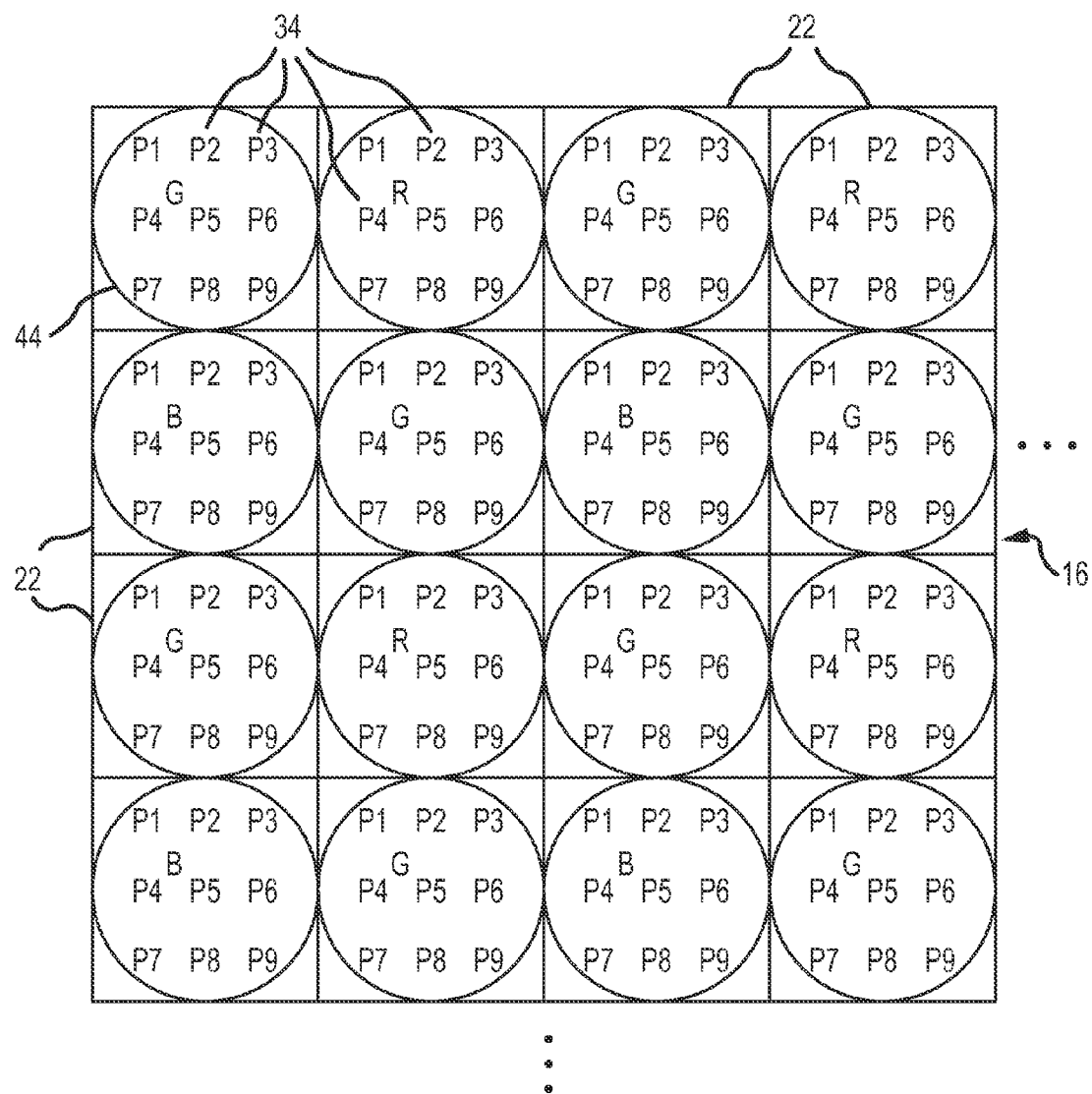
FIG. 9 is a diagram of an illustrative image sensor that includes pixels with multiple sub-pixels covered by a single microlens in accordance with an embodiment of the present invention.

FIG. 9 is an illustrative diagram showing an image sensor that may include pixels with multiple sub-pixels covered by a single microlens 44. In the embodiment of FIG. 9, each pixel 22 has nine sub-pixels 34 (P1, P2, P3, P4, P5, P6, P7, P8, and P9) arranged in three adjacent rows and three adjacent columns in a 3×3 arrangement. Each sub-pixel 34 may have a respective photosensitive area. Each sub-pixel in pixel 22 may be covered by a color filter element of the same color. For example, the sub-pixels 34 in each pixel 22 may all be covered by a red color filter element, a green color filter element, or a blue color filter element. Each sub-pixel 34 may have a respective color filter element, multiple color filter elements may each cover multiple sub-pixels 34 in each pixel 22, or a single color filter element may cover all nine sub-pixels in each pixel 22. Pixels 22 may be arranged in a Bayer mosaic pattern similar to the pattern shown in FIG. 7.

Because each pixel 22 is covered by a single microlens 44, pixels 22 may have phase detection capabilities. Any combination of sub-pixels may be used to detect phase. Sub-pixels may be used that are in the same row (e.g., P1 and P2, P2 and P3, P1 and P3, etc.), in the same column (e.g., P1 and P4, P4 and P7, P1 and P7, etc.), or diagonally opposite each other (e.g., P1 and P5, P5 and P9, P1 and P9, etc.). The large number of available sub-pixel combinations enables image sensor 16 to detect a variety of types of edges.

Figure 10A:
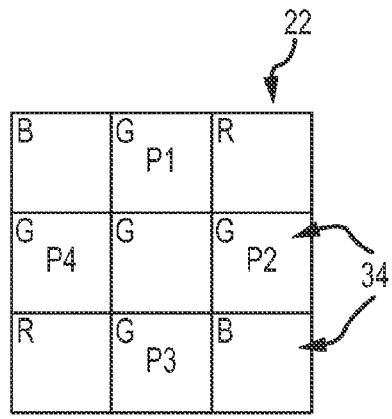
FIGS. 10A-10D are diagrams of illustrative arrangements of sub-pixels with different color elements in a pixel in accordance with an embodiment of the present invention.

In certain embodiments, the sub-pixels 34 in each pixel 22 may not all be the same color. FIGS. 10A-10D show embodiments of a pixel 22 with various arrangements of different colored sub-pixels. Pixel 22 of FIG. 10A has a 3×3 arrangement of sub-pixels that includes a green sub-pixel in the center of pixel 22. The center sub-pixel is adjacent to green sub-pixels on all sides (P1, P2, P3, and P4). These four sub-pixels may be used to gather phase detection data. For example, sub-pixels P4 and P2 or sub-pixels P1 and P3 may be used to determine phase information. Blue and red sub-pixels are positioned in opposite corners of pixel 22. In FIG. 10A, the sub-pixels for phase detection are shown as being green. This example is purely illustrative. Sub-pixels 34 may have any desired color arrangement. For example, the center sub-pixel and phase detections sub-pixels may be red, blue, or any other desired color.

Figure 10B:
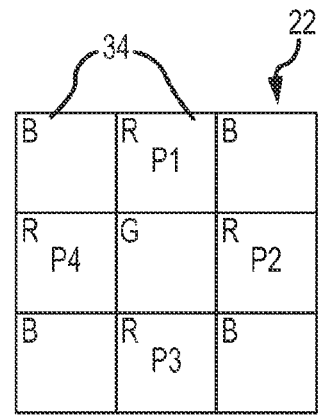

FIG. 10B shows another arrangement of sub-pixels 34 in pixel 22. In this embodiment, the center sub-pixel 34 is green. The center sub-pixel is adjacent to red sub-pixels on all sides (P1, P2, P3, and P4). These four sub-pixels may be used to gather phase detection data. For example, sub-pixels P2 and P4 or sub-pixels P1 and P3 may be used to determine phase information. Blue sub-pixels may be positioned in the corners of pixel 22. In FIG. 10B, the sub-pixels for phase detection are shown as being red. This example is purely illustrative. Sub-pixels 34 may have any desired color arrangement. For example, in one illustrative arrangement the center sub-pixel may be green, the phase detection sub-pixels may be blue, and the corner sub-pixels may be red. In another illustrative example, the center sub-pixel may be blue, the phase detection sub-pixels may be green, and the corner sub-pixels may be red. Any arrangement of colored sub-pixels may be used.

Figure 10C:
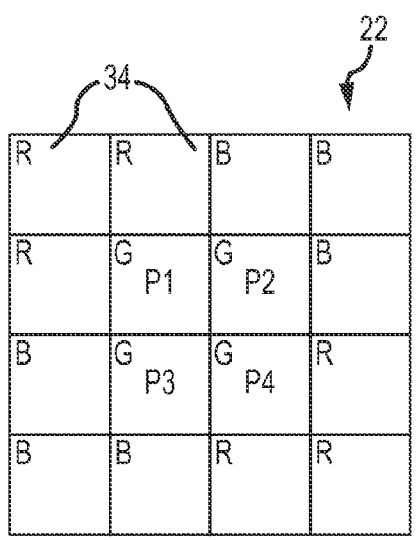

FIG. 10C shows yet another arrangement of sub-pixels 34 in pixel 22. In this illustrative embodiment, each pixel 22 has sixteen sub-pixels 34 arranged in four adjacent rows and four adjacent columns in a 4×4 arrangement. The sub-pixels in the center of pixel 22 may be green. These sub-pixels (P1, P2, P3, and P4) also may have phase detection capabilities. Sub-pixels in the same row (e.g., P1 and P2 or P3 and P4), in the same column (e.g., P1 and P3 or P2 and P4), or diagonally opposite each other (e.g., P1 and P4 or P2 and P3) may be used in phase detection applications. Pixel 22 may also include red sub-pixels in corners opposite each other and blue sub-pixels in the remaining corners opposite each other. In FIG. 10C, pixel 22 is depicted with green sub-pixels surrounded by red and blue sub-pixels. This example is purely illustrative. In various embodiments, the phase detection sub-pixels in the center of pixel 22 may be red, blue, or any other desired color.

Figure 10D:
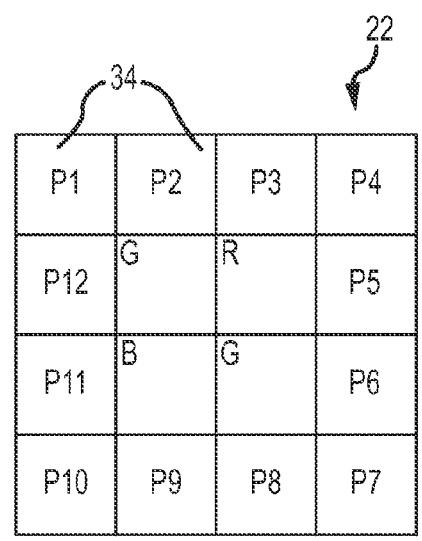

An alternate 4×4 arrangement for pixel 22 is shown in FIG. 10D. In this embodiment, the center of pixel 10D contains sub-pixels arranged in the Bayer mosaic pattern (a 2×2 square with two green sub-pixels at opposite diagonals and red and blue sub-pixels at opposite diagonals). The center sub-pixels are surrounded by phase detection sub-pixels (P1-P12). Any combination of sub-pixels P1-P12 may be used to determine phase information. For example, sub-pixels in the same row (e.g., P1 and P2, P1 and P4, etc.), sub-pixels in the same column (e.g., P1 and P12, P1 and P10, etc.), or sub-pixels positioned diagonally opposite from each other (e.g., P11 and P9, P12 and P8, P1 and P7, etc.). Phase detection sub-pixels P1-P12 may be clear to ensure that the sub-pixels are sensitive to incoming light.

Although not shown in FIGS. 10A-10D, pixels 22 in FIGS. 10A-10D may be covered by a single microlens 44.

Figure 11:
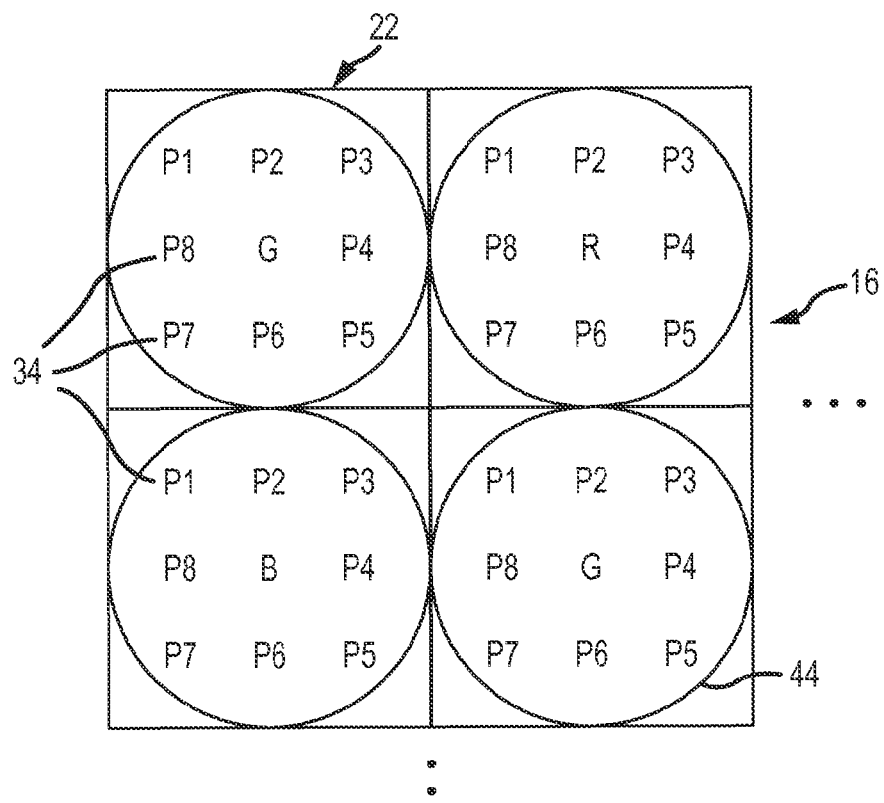
FIG. 11 is a diagram of an illustrative 3×3 arrangement for sub-pixels in an image sensor in accordance with an embodiment of the present invention.

FIG. 11 shows an illustrative 3×3 arrangement for pixels 22 in image sensor 16. Each pixel 22 may have a single colored sub-pixel at the center of the pixel. The colored sub-pixel in the center may be selected such that pixels 22 are arranged in the Bayer mosaic pattern. The sub-pixels at the edges of each pixel 22 (P1-P8) may be sub-pixels used for phase detection. The phase detection sub-pixels may transmit a broader range of light then the colored sub-pixels. For example, sub-pixels P1-P8 may be broadband sub-pixels. The wider range of transmission in sub-pixels P1-P8 may make the sub-pixels more sensitive to incoming light and result in higher quality phase detection data, as well as reduce the reconstructed image noise. Any combination of phase detection sub-pixels 34 may be used to calculate phase information. The colored sub-pixel may remain in the center of the each pixel 22 to provide an accurate image data value. Similar to how the values of each sub-pixel in pixels 22 of FIG. 7 may be averaged to produce an accurate value that represents pixel 22, a single colored sub-pixel in the center of pixel 22 may produce an accurate value that represents pixel 22 in FIG. 11.

Figure 12:
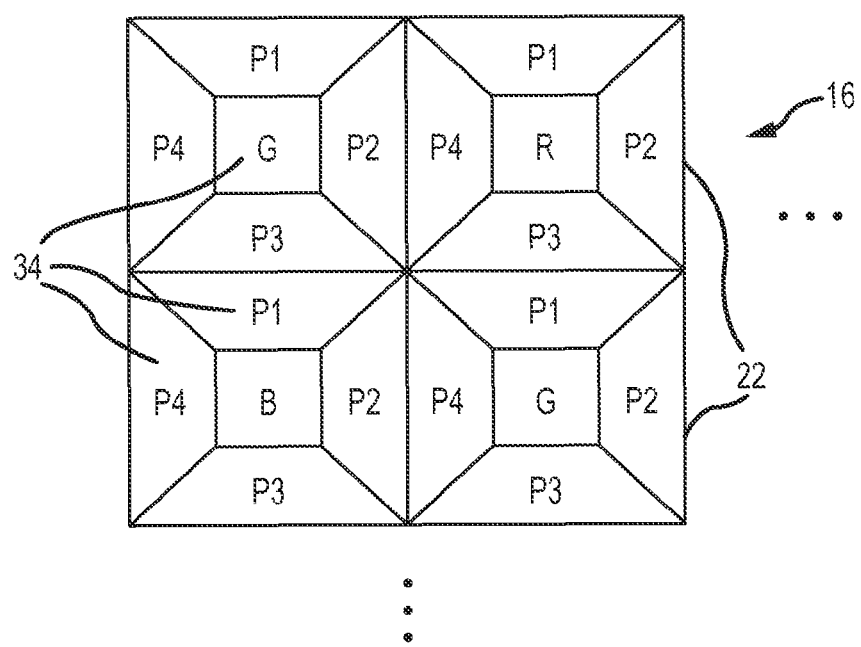
FIG. 12 is a diagram of an illustrative arrangement for sub-pixels in an image sensor in accordance with an embodiment of the present invention.

FIG. 12 shows an illustrative arrangement for image pixels 22 in an image sensor. Similar to the arrangement of FIG. 11, FIG. 12 shows a single colored sub-pixel 34 at the center of each pixel 22. The colored sub-pixel in the center may be selected such that pixels 22 are arranged in the Bayer mosaic pattern. The colored sub-pixel is surrounded by phase detection sub-pixels that may be clear. Instead of eight phase detection sub-pixels surrounding the center sub-pixel (e.g., FIG. 11), four phase detection sub-pixels may surround the sub-pixel as shown in FIG. 12. The phase detection sub-pixels (P1-P4) may have any desired shape or size. Similarly, the colored sub-pixel may have any desired shape or size. Any combination of phase detection sub-pixels 34 may be used to calculate phase information.

Although not shown in FIG. 12, pixels 22 in FIG. 12 may be covered by a single microlens 44.

If desired, image sensor 16 may be operated in a high-dynamic-range imaging mode. The dynamic range of an image may be defined as the luminance ratio of the brightest element in a given scene to the darkest element the given scene. Typically, cameras and other imaging devices capture images having a dynamic range that is smaller than that of real-world scenes. High-dynamic-range (HDR) imaging systems are therefore often used to capture representative images of scenes that have regions with high contrast, such as scenes that have portions in bright sunlight and portions in dark shadows.

An image may be considered an HDR image if it has been generated using imaging processes or software processing designed to increase dynamic range. As an example, HDR images may be captured by a digital camera using a multiple integration (or multiple exposure (ME)) process. In a multiple exposure process, multiple images (sometimes referred to as image frames) of the same scene may be captured using different exposure times (sometimes referred to as integration times). A short-exposure image captured during a short integration time may better capture details of brightly lit portions of the scene, whereas a long-exposure image captured during a relatively longer integration time may better capture details of dark portions of the scene. The short-exposure and long-exposure images may be combined into a composite HDR image which is able to represent the brightly lit as well as the dark portions of the image.

In another suitable arrangement, HDR images may be captured by a digital camera using an interleaved integration (or interleaved exposure (IE)) process. In an interleaved integration process, images having rows of long-exposure image pixel values are interleaved with rows of short-exposure image pixel values. The individual exposures may be captured in sequence or may overlap. Overlapping exposures may be desirable in some applications, as this arrangement may reduce motion artifacts and align the interleaved exposure readouts, which may reduce the required buffering. The long-exposure and short-exposure image pixel values in each interleaved image frame may be interpolated to form interpolated values. A long-exposure image and a short-exposure image may be generated using the long-exposure and the short-exposure values from the interleaved image frame and the interpolated. The long-exposure image and the short-exposure image may be combined to produce a composite HDR image which is able to represent the brightly lit as well as the dark portions of the image.

Figure 13A:
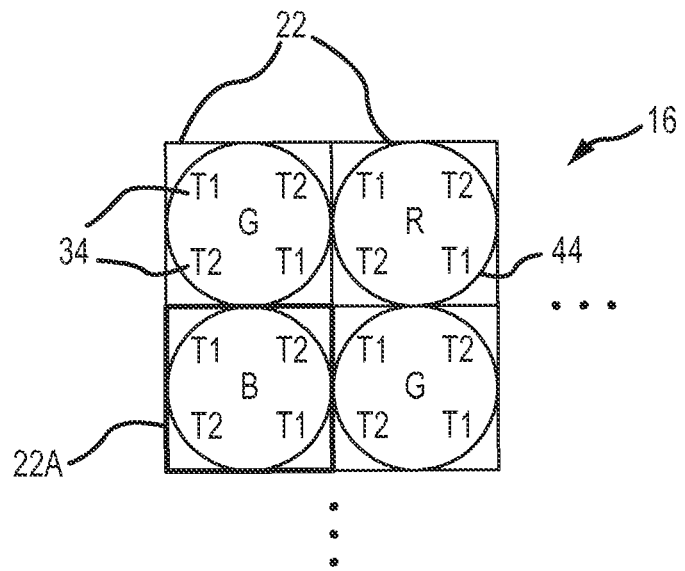
FIGS. 13A and 13B are illustrative diagrams showing how sub-pixels in a pixel may be provided with different integration times in accordance with an embodiment of the present invention.
Figure 13B:
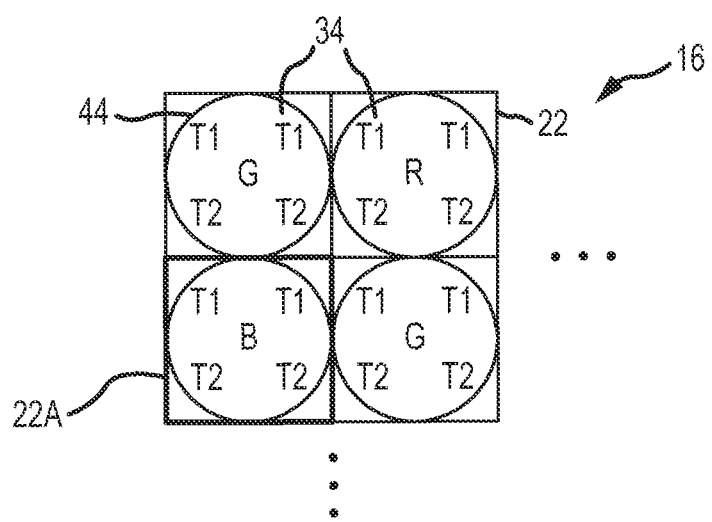

In certain embodiments, sub-pixels 34 may be operated with selected integration times to generate short and long exposure images for generating an HDR image. FIGS. 13A and 13B are illustrative diagrams showing how sub-pixels 34 in a pixel 22 may be provided with different integration (exposure) times. As shown, pixels 22 may include sub-pixels 34 that capture charge using a first integration time T1 or a second integration time T2. Pixel 22A in FIG. 13A is showed with the sub-pixels of the same integration time in each pixel 22 positioned diagonally opposite each other. Alternatively, pixel 22A in FIG. 13B shows sub-pixels of the same integration time positioned in the same row. These examples are purely illustrative. Each pixel 22 may include sub-pixels 34 that capture charge using any desired integration time. For example, each pixel may include four sub-pixels 34, with each sub-pixel capturing charge using a different integration time. Each pixel may include four sub-pixels 34, with two sub-pixels capturing charge at a first integration time and two sub-pixels capturing charge at a second integration time (e.g., FIGS. 13A and 13B). The sub-pixels with the same integration time have any desired arrangement. Sub-pixels with the same integration time may be positioned in any way (e.g., positioned diagonally opposite each other, in the same row, in the same column). Sub-pixels with the same integration time need not be adjacent and may be separated by intervening pixels with different integration times.

In certain embodiments, a pixel 22 may be used for both generating an HDR image and gathering phase detection data. Generating phase detection data from two sub-pixels that have different integration times may result in inaccurate phase detection information. However, in embodiments where multiple sub-pixels in each pixel have the same integration time (e.g., FIGS. 13A and 13B), phase detection information may be obtained. For example, pixel 22A in FIG. 13A has two sub-pixels with an integration time T1. These two sub-pixels may be used to gather reliable phase detection information. Similarly, the two sub-pixels with an integration time T2 may be used to gather reliable phase detection information. In this way, a single pixel may be used for both generating an HDR image and gathering phase detection data.

Figure 14:
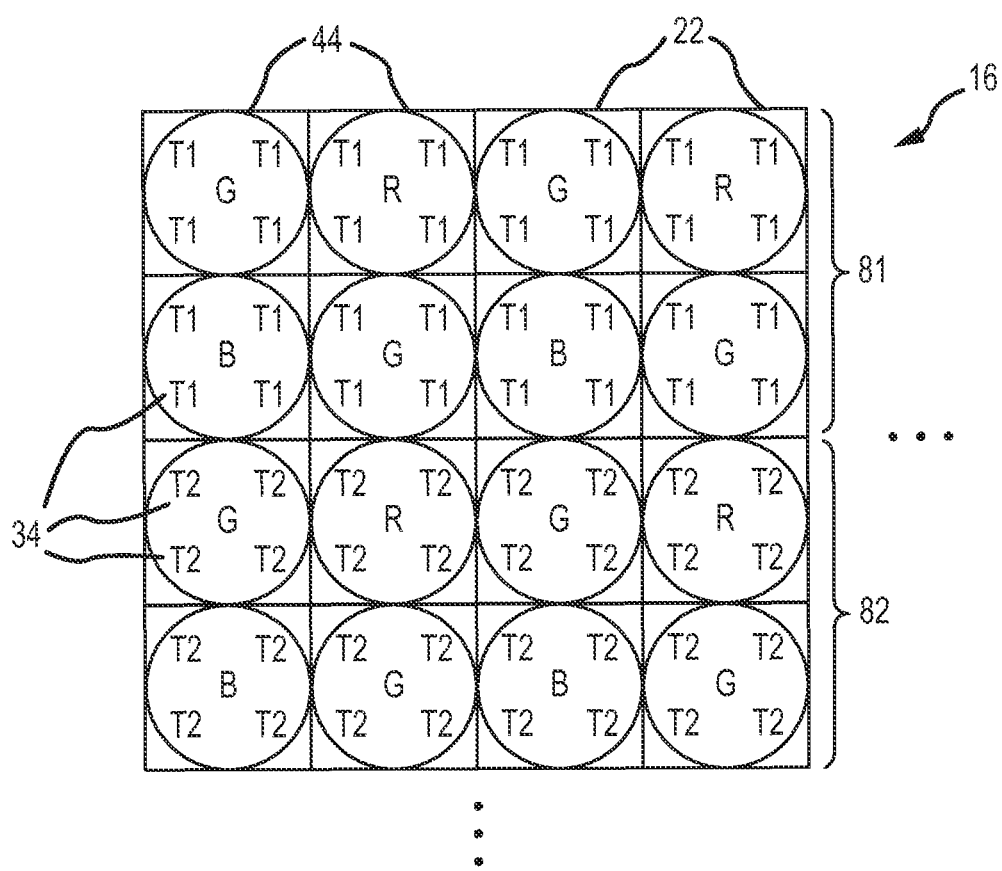
FIG. 14 is a diagram of an illustrative image sensor that may be used for generating a high-dynamic-range (HDR) image and gathering phase detection data in accordance with an embodiment of the present invention.

FIG. 14 shows an arrangement in which image sensor 16 may be used for generating an HDR image and gathering phase detection data. As shown, each pixel 22 may have sub-pixels 34 with the same integration time. However, a first group 81 of pixels 22 may have sub-pixels 34 with a first integration time T1, while a second group 82 of pixels 22 may have sub-pixels 34 with a second integration time T2. In this arrangement, because each pixel's sub-pixels have the same integration time, each pixel 22 will be able to generate phase detection data using any combination of sub-pixels. Additionally, the different integration times for the pixels may be used to generate an HDR image. Groups 81 and 82 may include any desired number of pixels. The pixels in groups 81 and 82 need not be adjacent. Pixels of any location may be used in groups 81 and 82. In the example of FIG. 14, two groups are shown. However, this example is purely illustrative and any desired number of groups may be used, with each group including pixels with the same integration time. For example, image sensor 16 may include three groups of pixels with three respective integration times, four groups of pixels with four respective integration times, or more than four groups of pixels with more than four respective integration times. The number of groups of pixels and the size and shape of each group may be dynamically updated depending on the characteristics of the scene being imaged.

Figure 15:
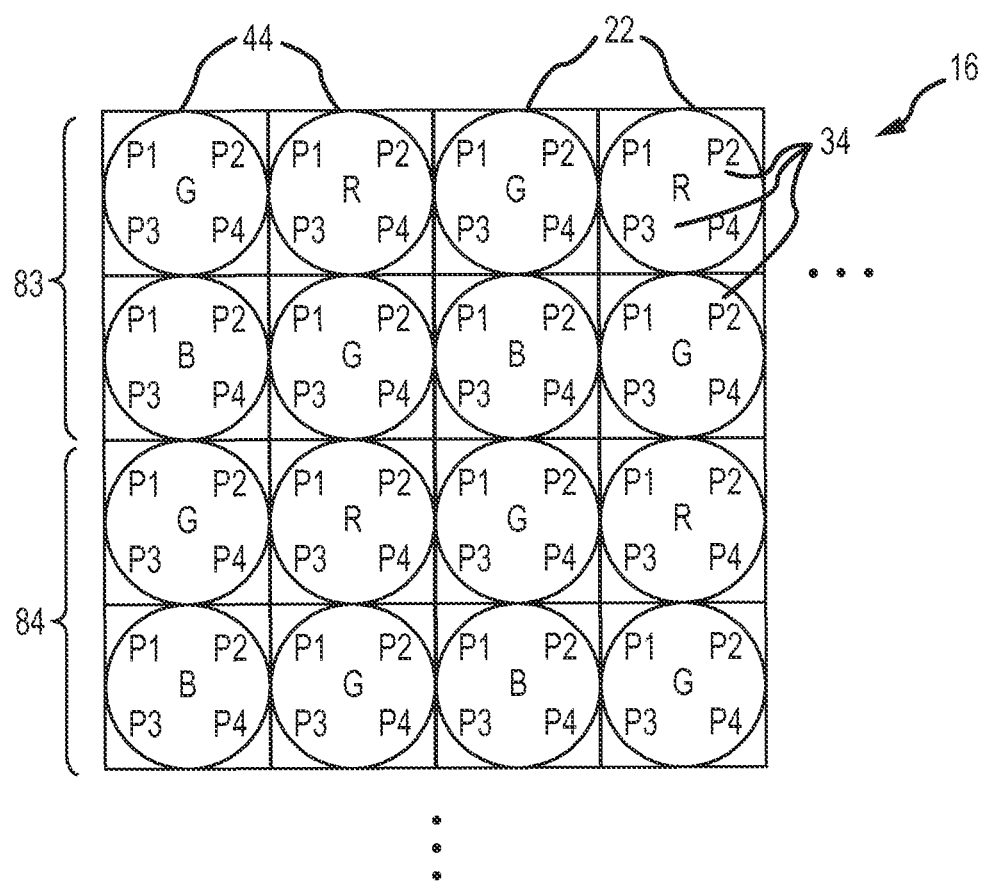
FIG. 15 is a diagram of an illustrative image sensor that may include some pixels used for phase detection and other pixels used for generating an HDR image in accordance with an embodiment of the present invention.

FIG. 15 is an illustrative diagram of image sensor 16 that may include pixels used for phase detection and other pixels used for generating an HDR image. For example, a first group 83 of pixels 22 may be used to gather optimal HDR data, while a second group 84 of pixels 22 may be used to gather optimal phase detection data. Sub-pixels 34 of pixels 22 in group 84 may have the same integration time to ensure optimal phase detection data, while sub-pixels 34 of pixels 22 in group 83 may have different integration times to gather data for generating an HDR image. Groups 83 and 84 may include any desired number of pixels. The pixels in groups 83 and 84 need not be adjacent. Pixels of any location may be used in groups 83 and 84. The size and shape of each group may be dynamically updated depending on the characteristics of the scene being imaged.

Various embodiments of the invention have been described including a method of operating an imaging system having an array of pixels arranged in rows and columns. Each pixel may include four adjacent photosensitive areas located in two adjacent columns and two adjacent rows and a microlens that covers the four adjacent photosensitive areas. The method may include generating image signals in the four adjacent photosensitive areas of each pixel, processing the image signals of each of the four adjacent photosensitive areas of at least one pixel to determine phase information, and processing the image signals of each of the four adjacent photosensitive areas of the at least one pixel to determine image information.

Processing the image signals of each of the four adjacent photosensitive areas of the at least one pixel to determine image information may include binning or averaging the image signals of each of the four adjacent photosensitive areas to obtain a single image signal value for each pixel of the at least one pixel. Each pixel may include a color filter element that covers the four adjacent photosensitive areas. The color filter element of each pixel may be part of a Bayer color pattern.

Processing the image signals of each of the four adjacent photosensitive areas of the at least one pixel to determine phase information may include processing the image signals to detect vertical edges, horizontal edges, and diagonal edges. Processing the image signals of each of the four adjacent photosensitive areas of the at least one pixel to determine phase information may include processing the image signals to detect red edges, blue edges, and green edges. The at least one pixel may include each pixel in the pixel array. The method may include using the phase information from each pixel in the pixel array to both help with the image rendering and create a depth map.

The four adjacent photosensitive areas may include first, second, third, and fourth photosensitive areas. The first photosensitive area in a plurality of the pixels may have a first exposure. The second photosensitive areas in the plurality of the pixels may have a second exposure. The first exposure may be different from the second exposure. The first photosensitive area may be positioned diagonally opposite the second photosensitive area. Alternatively, the first photosensitive area may be positioned in the same row or the same column as the second photosensitive area. The first photosensitive area may have a first exposure time, while the second photosensitive area may have a second exposure time that is different than the first exposure time. The method may include generating a high dynamic range image using the image signals from the plurality of the pixels.

In various embodiments of the invention, an image sensor may include a pixel array that includes an array of pixels arranged in rows and columns. Each pixel in the array may include a plurality of adjacent photodiodes, a microlens that covers the plurality of adjacent photodiodes, and a color filter element formed over the plurality of adjacent photodiodes. The pixel array may be configured to generate both image data and phase detection data using each pixel in the pixel array.

The color filter element of each pixel may be configured to pass light of a color to each of the four adjacent photodiodes. The color filter element of each pixel may be part of a Bayer color pattern. The color filter element of each pixel may be part of a color pattern. The color pattern may include a repeating unit square with first and second broadband pixels positioned diagonally opposite each other, a red pixel positioned adjacent to the first and second broadband pixels, and a blue pixel positioned adjacent to the first and second broadband pixels. Some of the proposed arrangements may include multiple color filters per pixel, removing the need for post-processing to recover all colors at all locations (de-mosaicing) otherwise required for typical (e.g., Bayer pattern) imagers.

The plurality of adjacent photodiodes may include four adjacent photodiodes. The four adjacent photodiodes may be located in two adjacent columns and two adjacent rows. The plurality of adjacent photodiodes may include nine adjacent photodiodes. The nine adjacent photodiodes may be located in three adjacent columns and three adjacent rows. At least two photodiodes of the plurality of photodiodes may have different angular responses. The at least two photodiodes may be used to calculate phase information. The plurality of adjacent photodiodes in each pixel may each be configured to generate an image signal in response to being exposed to light. The image signals of each photodiode of the plurality of adjacent photodiodes may have an average value, and the average value may be used to generate image data.

In various embodiments of the invention, a method may include forming an array of photodiodes in a substrate. The array of photodiodes may be arranged in a plurality of rows and columns. The method may include forming a plurality of microlenses over the array of photodiodes. Each microlens may cover a respective plurality of photodiodes to form a respective pixel. The method may include forming an array of color filter elements over the array of photodiodes. A respective color filter element may cover each respective plurality of photodiodes. The substrate may include first portions that are interposed between each pixel and second portions that are interposed between each photodiode in the respective plurality of photodiodes. The first portions of the substrate may be processed using a first method and the second portions of the substrate may be processed using a second method that is different than the first method. The first portions of the substrate may be implanted with a first dose of ions. The second portions of the substrate may be implanted with a second dose of ions. The first dose may be different than the second dose.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an imaging system having an array of pixels arranged in rows and columns, wherein each pixel comprises four adjacent photosensitive areas located in two adjacent columns and two adjacent rows, and wherein each pixel comprises a microlens that covers the four adjacent photosensitive areas, the method comprising:

generating image signals in the four adjacent photosensitive areas of each pixel;

processing the image signals of each of the four adjacent photosensitive areas of a first pixel of the array of pixels to determine phase information, wherein only the image signals of each of the four adjacent photosensitive areas of the first pixel are used to determine the phase information, wherein processing the image signals of each of the four adjacent photosensitive areas of the first pixel to determine phase information comprises processing the image signals of each of the four adjacent photosensitive areas of the first pixel to detect vertical edges, horizontal edges, and diagonal edges, and wherein only the image signals of each of the four adjacent photosensitive areas of the first pixel are used to detect the vertical edges, horizontal edges, and diagonal edges; and processing the image signals of each of the four adjacent photosensitive areas of the first pixel to determine image information, wherein only the image signals of each of the four adjacent photosensitive areas of the first pixel are used to determine the image information, and wherein processing the image signals of each of the four adjacent photosensitive areas of the first pixel to determine the image information comprises averaging the image signals of each of the four adjacent photosensitive areas to obtain a single image signal value for the first pixel.

2. The method defined in claim 1, wherein each pixel comprises a color filter element that covers the four adjacent photosensitive areas.

3. The method defined in claim 2, wherein the color filter element of each pixel is part of a Bayer color pattern.

4. The method defined in claim 1, wherein processing the image signals of each of the four adjacent photosensitive areas of the first pixel to determine phase information comprises processing the image signals to detect at least one of red edges and blue edges.

5. A method of operating an imaging system having an array of pixels arranged in rows and columns, wherein each pixel comprises four adjacent photosensitive areas located in two adjacent columns and two adjacent rows, and wherein each pixel comprises a microlens that covers the four adjacent photosensitive areas, the method comprising:

generating image signals in the four adjacent photosensitive areas of each pixel;

processing the image signals of each of the four adjacent photosensitive areas of at least one pixel to determine phase information, wherein processing the image signals of each of the four adjacent photosensitive areas of the at least one pixel to determine phase information comprises processing the image signals of each of the four adjacent photosensitive areas of the at least one pixel to detect vertical edges, horizontal edges, and diagonal edges, and wherein only the image signals of each of the four adjacent photosensitive areas of the at least one pixel are used to detect the vertical edges, horizontal edges, and diagonal edges; and processing the image signals of each of the four adjacent photosensitive areas of the at least one pixel to determine image information wherein the four adjacent photosensitive areas include first, second, third, and fourth photosensitive areas, wherein the first photosensitive area in a plurality of the pixels has a first integration time, wherein the second photosensitive area in the plurality of the pixels has a second integration time, and wherein the first integration time is longer than the second integration time.

6. The method defined in claim 5, wherein the first photosensitive area is positioned diagonally opposite the second photosensitive area.

7. The method defined in claim 5, wherein the first photosensitive area is positioned in the same row as the second photosensitive area.

8. The method defined in claim 5, further comprising generating a high dynamic range image using the image signals from the plurality of the pixels.

* * * * *